US007286356B2

(12) United States Patent
Keenan et al.

(10) Patent No.: US 7,286,356 B2
(45) Date of Patent: Oct. 23, 2007

(54) THERMALLY INSULATED CABINET AND METHOD FOR INHIBITING HEAT TRANSFER

(75) Inventors: James J. Keenan, Santa Barbara, CA (US); Richard W. Sevier, Goleta, CA (US)

(73) Assignee: Telect, Inc., Liberty Lake, WA (US)

( * ) Notice: Subject to any disclaimer, the term of this patent is extended or adjusted under 35 U.S.C. 154(b) by 0 days.

(21) Appl. No.: 10/825,907

(22) Filed: Apr. 15, 2004

(65) Prior Publication Data

US 2005/0231915 A1    Oct. 20, 2005

(51) Int. Cl.
*H05K 7/20*    (2006.01)
*H05K 5/00*    (2006.01)
*A47B 77/08*    (2006.01)

(52) U.S. Cl. .................. 361/700; 454/184; 312/223.1; 312/236

(58) Field of Classification Search ................ 361/700; 429/50, 62, 120
See application file for complete search history.

(56) References Cited

U.S. PATENT DOCUMENTS

| | | | | |
|---|---|---|---|---|
| 3,110,633 | A | * | 11/1963 | Bachmann ................... 219/200 |
| 4,913,985 | A | * | 4/1990 | Baer ........................... 429/50 |
| 5,832,988 | A | | 11/1998 | Mistry et al. ................ 165/103 |
| 6,006,944 | A | | 12/1999 | Machledt ..................... 220/567 |
| 6,104,611 | A | * | 8/2000 | Glover et al. ................ 361/700 |
| 6,164,369 | A | * | 12/2000 | Stoller ..................... 165/104.33 |
| 6,169,247 | B1 | * | 1/2001 | Craft et al. ................. 174/15.1 |
| 6,192,703 | B1 | * | 2/2001 | Salyer et al. ............... 62/457.7 |
| 2001/0033961 | A1 | * | 10/2001 | Gudmundsson et al. ...... 429/62 |

OTHER PUBLICATIONS

Maurice J. Marongiu & Randy L Clarksean, Thermal Management of Battery Compartments of Outdoor Telecommunication Cabinets using Phase Change Materials (PCM), Jul. 1997, pp. 29-34.*
*Thermal Management of Telecommunications Batteries Using Phase Change Materials (PCM) Jacket™*, Anthony P. Cosentino, abstract.
*Summary and Analysis of PCM Battery Jacket™*, Bradley J. Warbiany, abstract.
*Thermal Mass and Night Ventilation-Utilising "Hidden" Thermal Mass*, Nick Barnard, FaberMaunsell.
*Cooldeck*, Faber Maunsell, Company brochure and data sheet.

* cited by examiner

*Primary Examiner*—Jayprakash Gandhi
*Assistant Examiner*—Zachary M Pape
(74) *Attorney, Agent, or Firm*—Lee & Hayes, PLLC

(57) ABSTRACT

One embodiment of an cabinet according to the present invention comprises an inner cabinet having a plurality of inner walls that form an enclosure. A phase change material covers at least some of the plurality of inner walls. An outer cabinet is positioned around the inner cabinet and comprises a plurality of outer walls arranged such that there is a space between the inner and outer walls. A mechanism is included for drawing air from outside of the outer cabinet into the space between the inner and outer walls. The phase-change material is arranged to melt when exposed to heat energy to reduce heat transfer into the enclosure. The enclosure is particularly adapted for holding heat sensitive devices such as batteries with the cabinet controlling heat transfer during cyclic heat exposure.

28 Claims, 12 Drawing Sheets

THERMALLY INSULATED CABINET AND METHOD FOR INHIBITING HEAT TRANSFER

BACKGROUND OF THE INVENTION

1. Field of the Invention

This invention relates to thermally insulated enclosures and cabinets and more particularly to thermally insulated cabinets for protection against cyclic thermal exposure.

2. Description of the Related Art

Heat sensitive materials and components must sometimes be located in an environment that experiences heat fluctuations that are detrimental to their longevity or effectiveness. For example, the telecommunications industry typically uses lead acid batteries as a source of back-up power in the event of a power failure in locations removed from environmentally protected buildings. The batteries are typically stored in a cabinet that is exposed to elevated temperature from daytime ambient (usually in the summer). Cabinets located in an outside environment can be exposed to temperatures ranging from minus 20° Celsius(C.) to plus 55° C., and the temperature experienced by the cabinet spreads into its interior. Lead acid batteries experience damage or shortened life-span when exposed to these extreme temperatures. High temperatures are especially damaging and the life expectancy of lead acid batteries can be reduced by half for every 10° C. above the optimum 25° C. that the batteries are stored in.

The most common technique for protecting this type of equipment from extreme temperatures is to use an electric heater to raise low temperatures in the cabinet and air conditioning to lower high temperatures in the cabinet. These types of cabinets, however, are relatively expensive and the operating power for the heater and air conditioner adds to the overall operating expense of the cabinet. The heater and air conditioning units also require periodic maintenance of filters and compressors, and repair when the units fail. This also adds operating expense to the cabinets.

An apparatus for protecting batteries against damaging heat is disclosed in U.S. Pat. No. 6,006,944 to C. Machledt. A storage vault is described for storing batteries underground. Through the use of an underground vault, the sides are not exposed to ambient air temperatures and the sun. The top is insulated with fiberglass to protect the batteries from overhead sun. One disadvantage of such an underground vault is the high cost of installation, necessitating excavation for installation and the complexities of building a structure underground. Another disadvantage is the added cost of maintenance procedures that must be conducted underground.

Another apparatus for protecting either materials or components is disclosed in U.S. Pat. No. 5,832,988 to Mistry, which utilizes heat exchangers to cool cabinets. A columnar heat exchanger is mounted within the cabinet and is used in combination with a diverter for controlling the flow of outdoor air through the system. One disadvantage of this apparatus is that lead acid batteries do not generate much heat when idle or in operation, and heat exchangers typically only work when there is a temperature difference between the inside and outside environments with energy moving in the direction of higher temperature to lower temperature.

SUMMARY OF THE INVENTION

A need still exists, therefore, for an enclosure or cabinet that provides for improved control of thermal transfer during periods of cyclic heat exposure.

One embodiment of an electronic cabinet according to the present invention comprises an inner cabinet comprising a plurality of inner walls that form an enclosure. The cabinet also comprises a phase change material covering at least some of the plurality of inner walls. An outer cabinet is included and is positioned around the inner cabinet and comprises a plurality of outer walls arranged such that there is a space between the inner and outer walls. The cabinet also includes a mechanism for drawing air from outside of said outer cabinet into the space between said inner and outer walls.

One embodiment of a thermally insulated enclosure, according to the present invention comprises first and second walls coupled together, the first wall having a tray portion, and phase-change material (PCM) disposed in the tray portion that melts when exposed to heat energy to reduce heat transfer between the first and second walls. The enclosure improves control of thermal transfer during periods of cyclic heat exposure.

Another embodiment of an electrical enclosure according to the present invention comprises a plurality of walls to establish an electrical component cavity and a phase-change material substantially covering at least one of the plurality of walls, wherein the phase-change material insulates the electrical-component cavity from heat energy.

A method of insulating an electrical enclosure according to the present invention includes placing a phase-change material in a plurality of containers, placing the containers between at least two supports, and coupling the supports to the electrical enclosure, wherein the phase-change material provides insulation for the electrical enclosure from heat energy.

In one embodiment of the invention, an electrical enclosure is described that includes a phase-change panel, an exterior panel spaced adjacent to the phase-change panel, and a fan to circulate air between the phase-change panel and exterior panel, wherein the fan reduces thermal energy introduced to the phase-change panel by the exterior wall.

BRIEF DESCRIPTION OF THE DRAWINGS

The components in the figures are not necessarily to scale, emphasis instead being placed upon illustrating the principals of the invention. Like reference numerals designate corresponding parts throughout the different views.

DETAILED DESCRIPTION OF THE INVENTION

Figure 1:
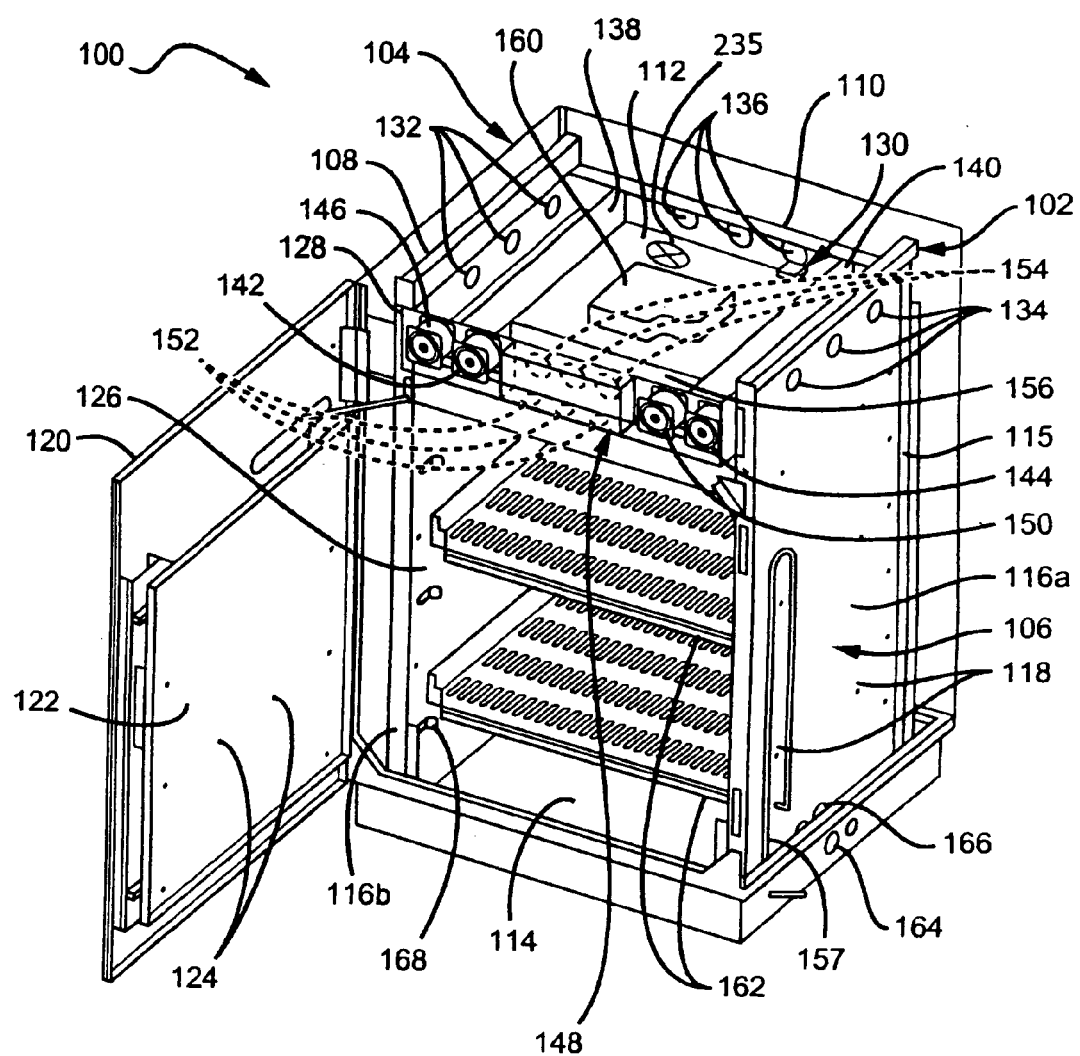
FIG. 1 is a perspective view of one embodiment of a cabinet according to the present invention that comprises an inner and outer cabinet.

FIG. 1 shows one embodiment of an enclosure/cabinet 100 according to the present invention that comprises an inner cabinet 102 arranged within an outer cabinet 104 such that there is space between most surfaces of the inside cabin et 102 and the adjacent surface of the outside cabinet 104. The inner and outer cabinets 102, 104 can have different shapes and sizes according to the present invention and can provide different spacing between adjacent surfaces. The outer cabinet 104 is shown in FIG. 1 (and some of the following figures) without a top and right surface so that the inner cabinet 102 is visible. It is understood that the outer cabinet 104 contains these surfaces that are not shown and the missing surfaces are present in the finally assembled cabinet 100.

The inner cabinet 102 is generally defined by right, left, rear, top and bottom inner walls 106, 108, 110, 112, 114 made of a rigid material such as metal or plastic, with a suitable material being steel. The walls are mounted to each other into a single inner cabinet by mounting methods such as screws, bolts or clamps, with a preferred mounting method being welds. In different embodiments of the cabinet 100 according to the present invention, the inner cabinet 102 can be arranged in different ways to hold a PCM on or near the cabinet walls 106, 108, 110, 112, 114 so that heat sensitive components can be mounted in the cabinet 100. The interior of the inner cabinet is substantially surrounded by the PCM which helps to protect the inner cabinet interior from outside heat.

In the embodiment shown and as more fully described below in FIG. 2, the PCM can be held on each of the right, left and rear walls 106, 108, 110, in rectangular holding trays. As more fully described below, the PCM helps keep the interior of the inner cabinet at proper temperature without the use of heaters and air conditioners. A right tray 116a is shown on the right-inner wall 106, a left tray 116b is shown on the left wall 108 and the rear wall 110 has a similar rear tray 116c that is more clearly shown in FIG. 7. Each of the trays include inner flanges 115 to establish a holding area for receipt of the PCM. The top plate or cover of the right tray 116a is not shown but it is understood that in an assembled cabinet a top plate is included on the tray 116a (as well as trays 116b, 116c) to define a top surface for the tray holding space.

Spacers 118 project from the right-inner wall 104 and are arranged so that a top plate can be mounted on the tray 116a with the spacers defining the separation between the bottom of the tray 116a and the top plate. The top plate can be mounted to the spacers using many different mounting methods, with the preferred spacers 118 having a longitudinal threaded hole and the top plate having holes aligned with the spacers 118. Screws or bolts can then be passed through each of the top plate holes and threaded into the spacers 118 to mount the top plate to the tray 116. Alternatively, the spacers 118 can extend through the top plate with a friction fit, weld or screw fit to maintain spacing and in each mounting method, the top plate and tray arrangement provides structural rigidity of the tray for the cabinet to withstand seismic activity.

Figure 2:
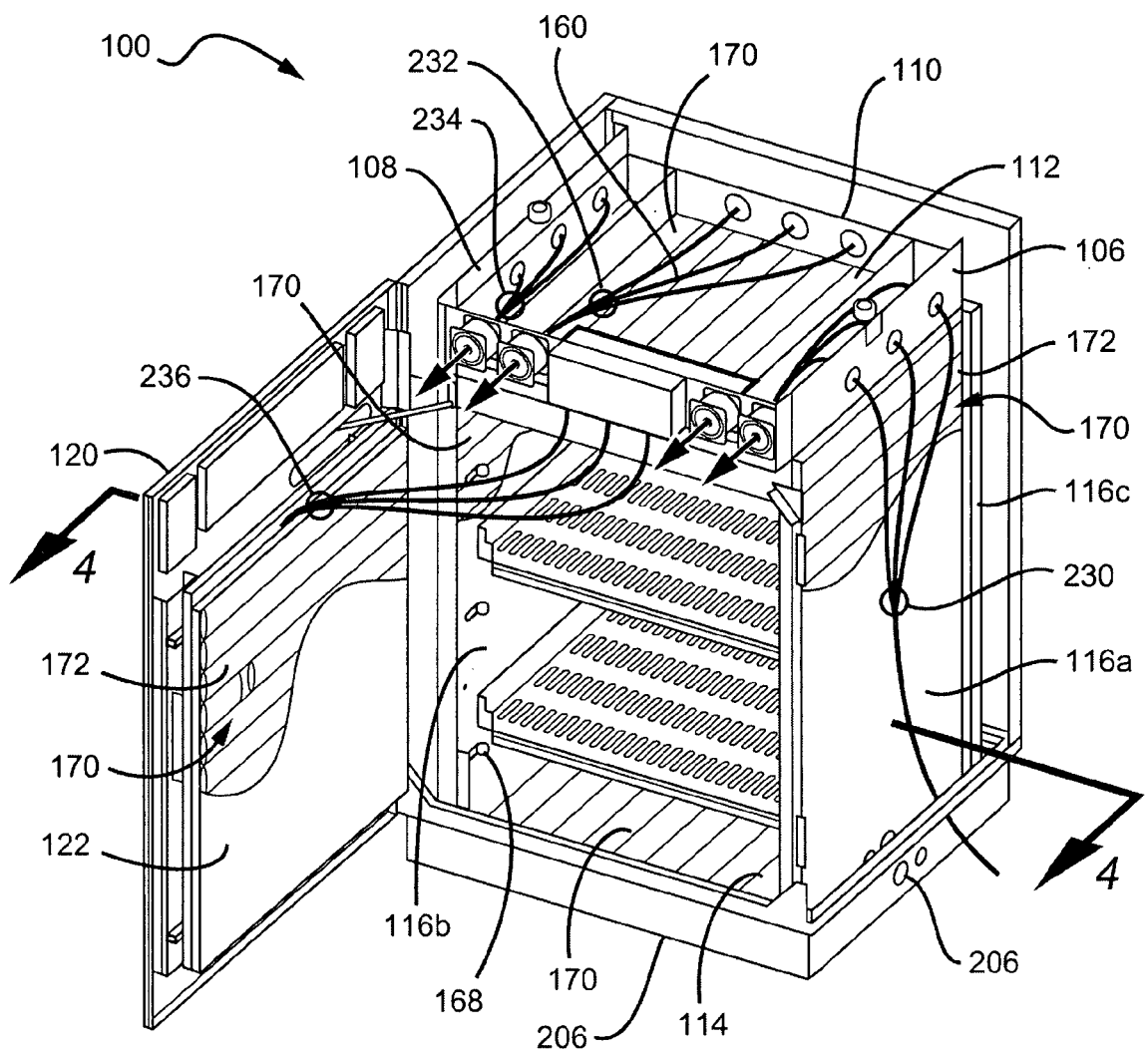
FIG. 2 is a perspective view of the cabinet in FIG. 1 with phase change material on the walls of the inner cabinet.

A space is maintained between each of the trays 116a-c and its adjacent outer cabinet wall with each of the inside surfaces of the outer cabinet 104, preferably covered by a layer of insulation described in FIG. 2. Even with the insulation installed, a space is maintained between the trays and insulation at each of the walls 106, 108, 110, hereinafter referred to as "tray/insulation space." Dimples can be included on the tray covers that face each tray/insulation space or structures can be included within each of the tray insulation spaces, both of which can cause turbulence in the air flow within each of the air spaces. This can improve the heat transfer from the tray to the passing air. The top and bottom walls 112, 114 preferably have trays, and can include covers over the trays. These covers, however, are not necessary and the PCM can simply be placed in the trays on these surfaces to be held in place by the force of gravity.

Outside cabinet 104 also comprises a cabinet door 120 that is arranged to support a door PCM tray 122. The tray 122 is also shown without its top plate and also includes door tray spacers 124 to support and hold the tray top plate and maintain proper separation between the plate and tray bottom. When the cabinet door 120 is closed its inside surface covers the opening 125 (shown in FIG. 10) in the outside cabinet 104 and the PCM tray 122 covers the opening 126 in the inside cabinet 102. Gaskets can be included around each of the opening 125, 126 and around the surface of the door 120 and the PCM tray to form an airtight seal around the openings 125, 126. Many different gaskets can be used, with a preferred gasket being foam rubber.

The right, left and rear-inner walls 106, 108, 110 extend up beyond the top-inner wall 112, and a fan panel 128 is installed above the opening in the inner cabinet 102, all of which establish an upper tray 130. The upper tray 130 is arranged to selectively draw outside air into the tray/insulation space at each of the walls. The section of the left, right and rear walls 106, 108, 110 that extend above top wall 112 have left, right and rear ventilation holes 132, 134, 136, respectively. The upper tray 130 also has first and second partitions 138, 140 that divide the upper tray 130 into regions and separates the left, right and rear ventilation holes 132, 134, 136 from each other. The fan panel 128 includes left, right and rear panel fans 142, 144, 146 that work with the partitions 138,140 and ventilation holes 132, 134, 136 to selectively draw air into the tray/insulation spaces at right left and rear walls 106, 108, 110. For example, one of the fans in fan panel 128 can work with upper tray 130 to draw outside air into tray/insulation space of the right wall, without drawing air in the other tray/insulation spaces. The panel fans 142, 144, 146 and flow partitions 138, 140 can be coupled to form a fan box to be placed or coupled onto the top inner wall 112.

The upper tray 130 also comprises a first fan box 148 that is arranged to work with the cabinet door 120 so that when the door 120 is closed, the fan box 148 is arranged substantially over the door tray/insulation space. The fan box 148 has bottom holes 152 that open to the tray/insulation space and back holes 154 that open to the interior of the upper tray 130. The upper tray 130 also comprises a third partition 156 that blocks the back holes 154 and front fan 150 from the other tray holes 132, 134, 136 and fans 142, 144, 146. The fan box 148 and area created the third partition 156 have a cover over their top opening. This arrangement provides an air path from the door tray/insulation space, through the bottom holes 152, through the back holes 154 and to the front fan 150. This allows the front fan 150 to draw outside air into the door tray/insulation space as described in more detail below in reference to FIG. 2.

One embodiment of the cabinet 100 holds batteries, which can expel hydrogen. To avoid a dangerous build-up of hydrogen in the inner cabinet, hydrogen vents 235 can also be included on one or more of the inner cabinet walls 106, 108, 110, 112, for removal of the battery hydrogen. As shown in FIG. 1, the hydrogen vent is included at the base of the upper tray 130, in the top wall 112, and comprises a vent through which hydrogen can pass. In one embodiment according to the present invention there is a cavity at the bottom of the upper tray 130 with a filter at the bottom and a solid plate with exhaust holes at the top. An exhaust device such as a fan or vacuum pump is attached to these holes to remove the gas.

The filter can comprise very small pores that allow small size gases like hydrogen and helium to pass easily but restrict the flow of heavier gasses. A variety of filters to serve this purpose are available. The arrangement is designed to expel only hydrogen from the inner cabinet while allowing most or all of the other gasses to remain. This has the effect of exhausting the hydrogen while keeping the overall air flow through the cabinet low. To assist the flow of gasses a vacuum pump can be used to create a negative pressure in the filter cavity and then to exhaust the gasses to the outside of the cabinet.

It can also be desirable to have some air enter the inner cabinet so that any hydrogen that develops from the batteries is exhausted efficiently. This air would replace the hydrogen and small amounts of other gasses exhausted through the air filter, thus avoiding any vacuum in the cabinet. It is desirable that any air brought into the inner cabinet is as cool as possible to avoid heating the space and subsequently the batteries. In one embodiment according to the present invention and air inlet duct 157 can be used that can comprise a small stainless steel tube (approximately ¼") placed inside a PVC plastic pipe (approximately ¾") thinwall electric), with the between the tubes filled with PCM salts. The duct can enter the cabinet at the bottom and then run up one of the air spaces to near the top of the space. The duct then returns down to the bottom again and is open to the air space near the air input slots. This allows the air in the ¼" tube to be cooled with the surrounding melting PCM salts and keeps the air cooled to 30° C. or less. In some applications it may be desirable to use a lower melting salt like 25° C. to keep the air flowing through the tube cooler.

Hydrogen is typically only present in small quantities if the batteries are functioning properly and the presence of hydrogen at elevated levels can an indication that something is wrong with the batteries. A hydrogen sensor could be included in the cabinet 100 to turn on the vacuum pump only when hydrogen gas is present. This arrangement could extend the life of the pump and also give a warning that hydrogen was present and the batteries may not be functioning properly.

The hydrogen can then be drawn out of the upper tray 130 by the rear panel fan 146 to the outside of the inner cabinet 102 where it can dissipate to the outside through spacing around the edge of the cabinet door 120. A top dust cover 160 can be positioned over and spaced apart from the vents to allow the hydrogen to escape to the upper tray 130 while inhibiting the transfer of warm air into the interior of the inner cabinet 102.

Rigid racks 162 are provided in the interior of the inner cabinet 102 to support thermally sensitive material or electronics, such as batteries. The outer cabinet 104 can have outer cable access holes 164 that are aligned with inner cable access holes 166 in the inner cabinet 102 for electrical or power cables to pass into the interior of the inner cabinet 102. The holes can be threaded or non-threaded to accept conduit or pipe fittings. The interior of the inner cabinet 102 can also include cable clips 168 to hold cables running on the interior of the inner cabinet 102.

FIG. 2 shows the cabinet 100 with PCM 170 in the trays 116a-c of the right, left and rear walls 106, 108, 110, and on the upper and bottom walls 112, 114. PCM 170 is also included in the door tray 122. The PCM 170 serves as the primary thermal barrier to protect the temperature sensitive components held in the interior of the inner cabinet 102. Many different PCMs can be used, with a suitable material being a commercially available hydrated salt PCM. Hydrated salts are available with different ranges of characteristics, such as different melting temperatures and latent heat over different operating temperature ranges. A suitable PCM that can be used in the cabinet 100 has a melting temperature of approximately 29° Celsius (C.), has a latent heat of approximately 158 KJ/Kg over its operating temperature range of approximately 26° C. to 32° C.

The PCM 170 can be arranged in many different ways within the trays 116a-c, 122 according to the present invention such being held in the trays without containers or in a single container within the trays. Alternatively, the PCM 170 can be held in vertical compartments/containers in the trays. These arrangements, however, can result in a separation condition in the PCM after the PCM has gone though melting and solidifying cycles. The crystalline/solid state of the PCM provides greater heat absorption compared to its liquid state, and as a result, it is desirable to limit separation of liquid and solid PCM within the trays. In most PCMs the solid state is denser than that liquid state which can cause the solid material to drop to the bottom of the tray. This can leave the liquid material at the top to allow heat flow into the inside of the inner cabinet 102 through the liquid. Because heat rises, a situation can be presented wherein the solid phase material at the bottom of the cavity does not effectively keep the interior of the inner cabinet 102 cool.

To reduce the impact of PCM separation, in one embodiment of the cabinet according to the present invention, the PCM is divided into smaller horizontal compartments 172. There can be some minimal separation in each of the compartments but any liquid that separates from the solid remains in close proximity to the solid PCM. The solid PCM in the compartments above and below a compartment with separated liquid helps prevent heat from flowing through the material in liquid form and helps keep the liquid material relatively cool. The minimal separation in each of the horizontal areas helps the PCM in each of the trays to provide a good barrier to heat flow. This horizontal arrangement also promotes faster solidification of the melted phase material.

The horizontal compartments 172 can be defined by containers of rigid material with square, round or oval cross sections, each of which is substantially filled with a phase material. The containers should be stacked on top of each other in the trays so there is no air space between adjacent containers that might allow for heat to flow between the containers. A preferred cross section for a rigid container according to the present invention is square, such that each of the trays are substantially filled with a PCM of uniform thickness. The rigid containers can be of a length that is the same as the width of the trays or the rigid containers could be smaller "bricks" that can be stacked to fill the trays.

Another preferred horizontal container embodiment according to the present invention comprises salt tubes made of a flexible and durable material such as polyurethane or nylon polyethylene. A suitable tube material comprises a commercially available nylon polyethylene referred to as Marvelseal 360 specification MIL-PRF-131J, provided by Ludlow Coated Products. The tubes can be provided in different lengths and can be different diameters, with a preferable diameter being in the range of 1-2 inches. In each of the wall trays 116a-c and the door tray 122, the tubes preferably extend substantially the width of each tray 116a-c, 122 and should be stacked to substantially the entire height of each tray 116a-c, 122. Alternatively, shorter tubes can be used and positioned end to end across the tray width, with longer or shorter tubes stacked to fill the trays.

In one embodiment according to the present invention the trays 116a-c, 122 are approximately ¾ of an inch deep and the diameter of the salt tubes is approximately 1½-inches. By having a tube diameter that is greater than the depth of the trays 116a-c, 122 the tubes can conform the space in the trays such that substantially all of the space within each tray is filled with PCM as shown below in FIG. 4.

Figure 3:
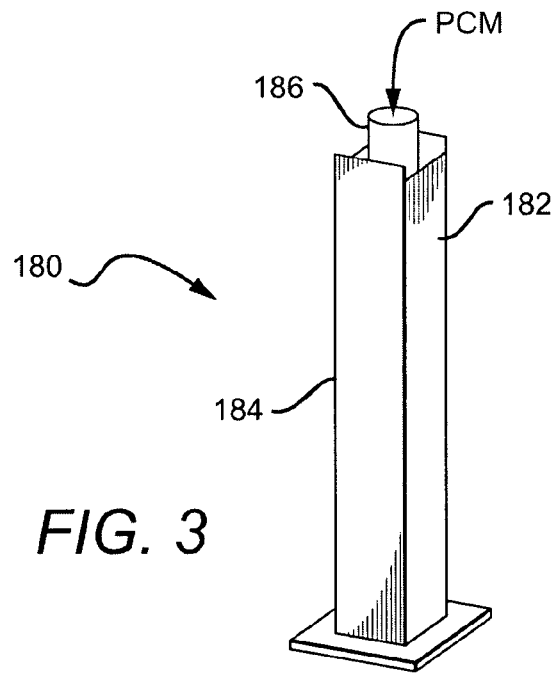
FIG. 3 is a perspective view of one embodiment of a tube filling apparatus according to the present invention.

During assembly of the cabinet 100, the PCM is preferably heated to a liquid state so it can be poured into the tubes and the tubes can then be placed as desired in the right, left, rear, and door trays and on the top and bottom walls 110, 114. The salt in the tubes can then be allowed to solidify such that the tray is filled with a solid PCM. FIG. 3 shows one embodiment of a tube filling apparatus 180 that can be used to fill each tube with the appropriate amount of liquid PCM so that the tubes fit properly within the trays. The apparatus 180 is elongated and hollow and has first and second opposing walls 182, 184. It has a height that is approximately equal to the width of the trays 116a-c, 122 (shown in FIG. 2) and also has a depth that is approximately equal to the depth of the trays 116a-c, 122, such as approximately ¾ of an inch in this case. An empty tube 186 is placed in the apparatus 180 and is filled with the liquid PCM. The open end of the tube 186 can then be sealed, preferably by heat sealing, and the tube 186 can be placed in one of the trays 116a-c, 122. This process can be repeated until all the tubes are filled and placed in the trays. Alternatively, the liquid material in the first filled tube can be poured out to measure the amount that fills the tube. Subsequent tubes can be filled with this amount of liquid without the use of the tube filling apparatus 180.

In another embodiment, two sheets of plastic, polyurethane, or nylon polyethylene can be bonded together at intervals to achieve an array of PCM salt containing sections or containers. Each of the sections can then be filled with the PCM to form side by side sections of PCM. The bonded sections could also be formed in a zigzag arrangement to allow adjacent salt containing sections to touch each other.

In one embodiment of an assembly method according to the present invention, each of the right left and back walls 106, 108, 110, and the door 120 is filled with PCM before being assembled as part of the inner or outer cabinets 102, 104. When being filled with PCM each can be laid flat and the top plate of the tray is removed. The tubes with liquid PCM can then be placed in the tray, adjacent to other tubes. The top plate can then be replaced on the tray and the PCM can be allowed to solidify, after which the particular wall can be included as part of the cabinet 100. Alternatively, one of the walls 106, 108, 110 can be removed from an assembled inner cabinet 102 and filled using this method, and the door 120 can be removed from the outer cabinet 104 and filled using this method.

It is understood that PCM on the top wall 112 and bottom wall 114 can be arranged without compartments. The danger of separation is not as great on these walls because they are usually horizontal and the cabinet 100 is mounting on a horizontal surface. Accordingly, the separation associated with vertical walls is substantially avoided. If, however, the cabinet 100 is not mounted on a horizontal surface, it would be desirable to have the PCM compartmentalized on these surfaces.

The inside surfaces of the outer cabinet 104 and the inside surface of the door 120 also have a layer of insulation 174 and the inner and outer cabinets 102, 104 are arranged such that an air space remains between the trays and insulation 170 (i.e. tray/insulation space) to allow for air flow between the two. Insulation 174 can comprise many different materials such as extruded polystyrene, expanded polystyrene, polyurethane or polyisocyanurate foams. A preferred material is a commercially available high-density fiberglass that is available in many different thicknesses, with a preferred thickness being approximately 1-inch. Similar insulation would be provided on right and top exterior walls (not shown).

It is also understood that when in use, cabinet 100 can be mounted on a slab that can be made of many different materials, including cement. In these arrangements the slab can remain relatively cool, even during the hotter times of the day. As a result, the bottom wall 114 may not need PCM material as a barrier to elevated temperatures. It can instead have a layer of insulation or left uncovered.

Figure 4:
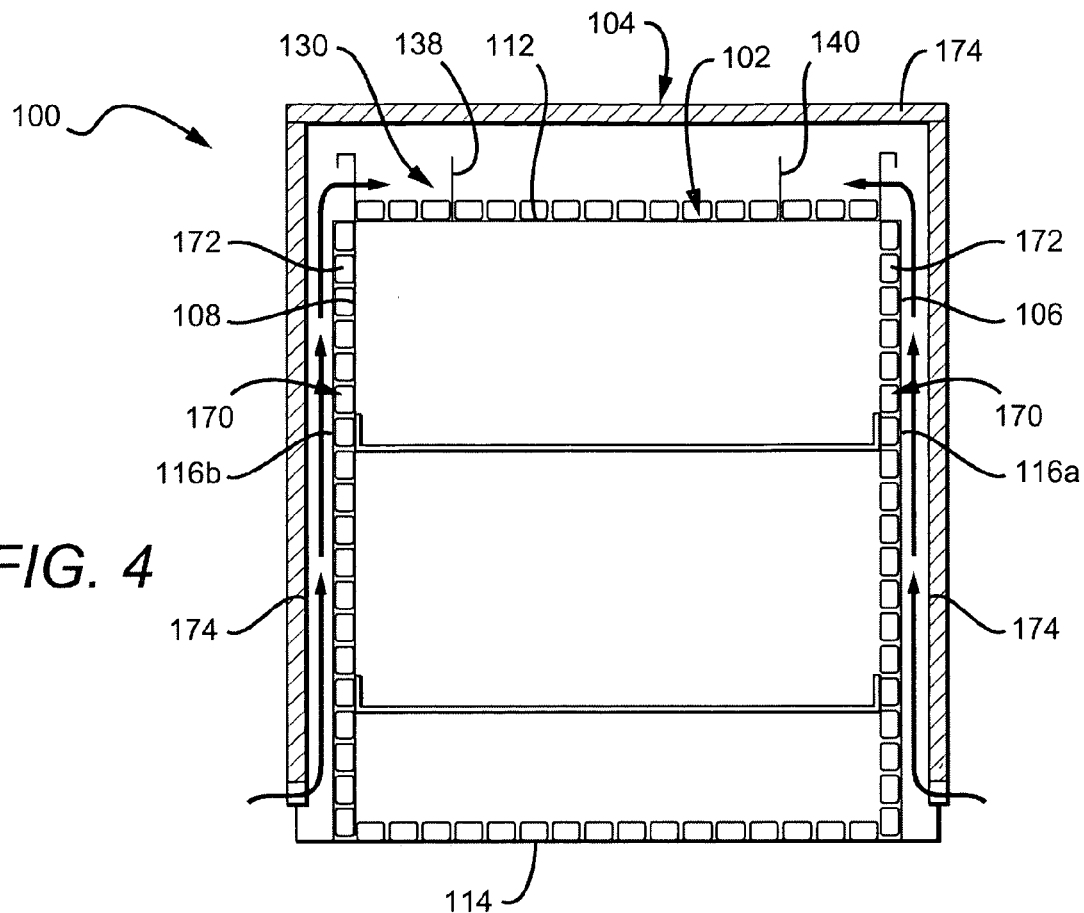
FIG. 4 is a sectional view of the cabinet shown in FIG. 2.

FIG. 4 shows a sectional view of the cabinet 100 shown in FIG. 2, taken along section lines 4-4 and shows the inner cabinet 102, with its right, left, top wall and bottom wall 106, 108, 112, 114. The right and left walls 106, 108 have respective trays 116a, 116b filled with PCM 170 in horizontal containers/compartments 172, in this case tubes of flexible material. As described above, the diameter of the tubes is larger than the depth of the trays 116 and the tubes are not completely filled with PCM. This allows the horizontal containers to conform to the depth of the trays 116a, 116b such that the tray is essentially filled with the PCM. The top and bottom walls 112, 114 also have PCM 170 in horizontal containers 172, although as mentioned above, the PCM 170 can be arranged differently on these walls. The horizontal containers are placed adjacent to one another closely enough that they cover the walls in a layer of PCM having substantially the same thickness.

The outer cabinet 104 has the layer of insulation 174 on its inside surfaces and a tray insulation space remains at the right and left wall 106, 108. As mentioned above, the right and left walls 106, 108 extend above the top wall 112 to form the upper tray 130. The upper tray 130 also comprises first and second partitions 138, 140 that work in conjunction with the fan panel 128 (shown in FIGS. 1 and 2) to draw outside air into the space between the trays 116a, 116b and insulation 174 on the right, left and rear walls 106, 108, 110. The inner rigid racks 162 are shown spanning horizontally across the interior of the inner rack 102 for holding the batteries.

Figure 5:
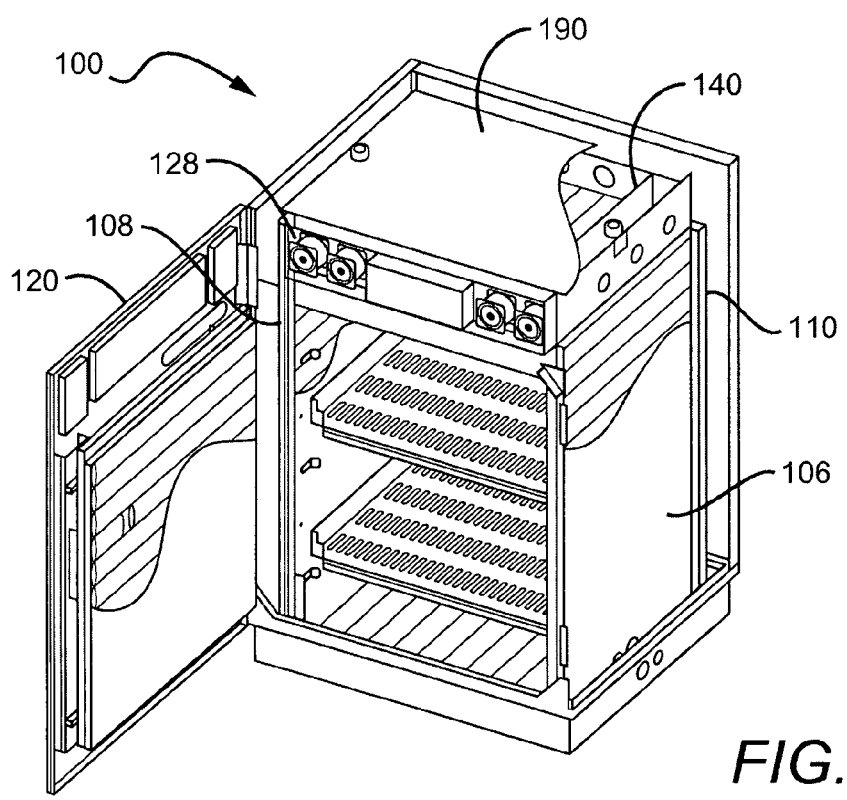
FIG. 5 is a perspective view of cabinet in FIG. 2 with a top middle wall.

FIG. 5 is a perspective view of the cabinet 100 shown in FIGS. 1 and 2 with the upper tray 130 enclosed by a top middle wall 190. The enclosure provides the top surface for the upper tray 130 that works with the first, second and third partitions 138, 140, 156 (best shown in FIG. 1) to separate the upper tray in compartments that work with the fan panel 128 to selectively draw outside air into the wall space between one or more of the tray/insulation spaces at the walls 106, 108, 110 and the door 120. The top inner wall 190 can include a layer of insulation or PCM on its top or bottom surface.

Figure 6:
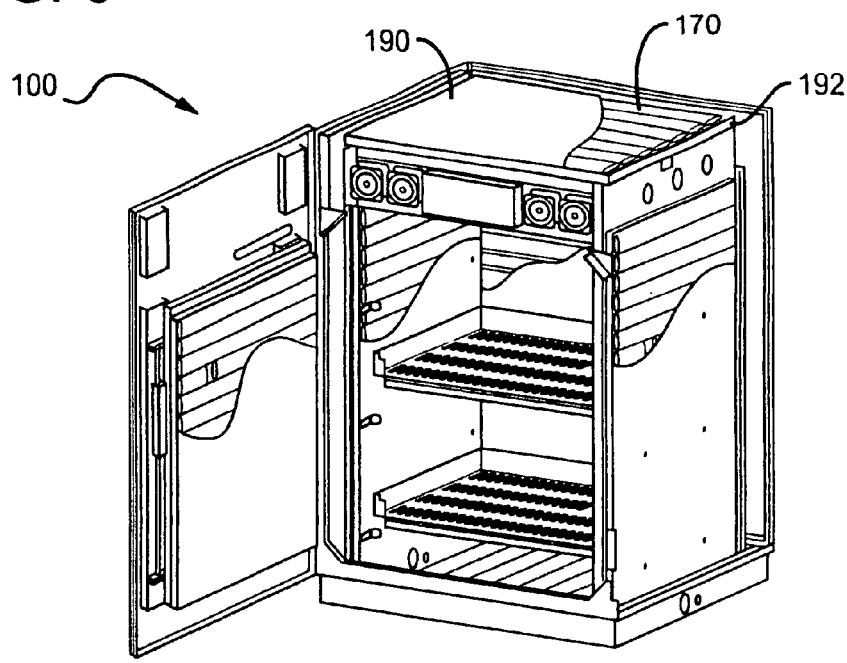
FIG. 6 is perspective view of the cabinet in FIG. 5 with a phase change material on the top middle wall.
Figure 7:
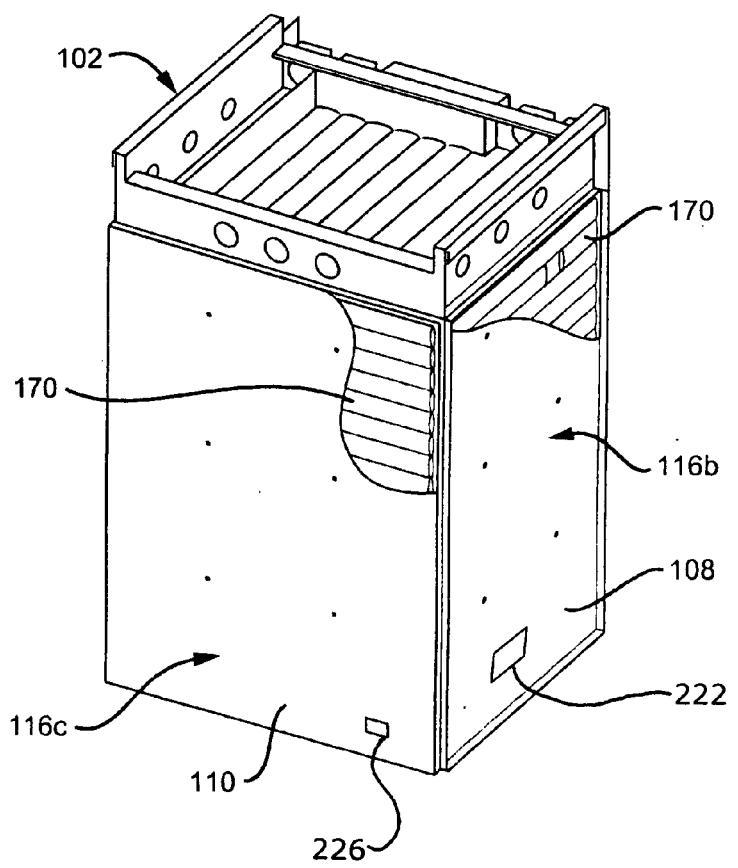
FIG. 7 is a rear perspective view of the inner cabinet shown in FIG. 2.

FIG. 6 shows the cabinet 100 of FIG. 5 with the top middle wall 190 comprising a tray 192 for holding PCM 170. As shown the PCM is held in horizontal containers. FIG. 7 is a rear perspective view of the inner cabinet 102 showing the left and rear wall 108, 110, each of which has a respective tray 116b, 116c that holds PCM 170 in horizontal containers.

Figure 8:
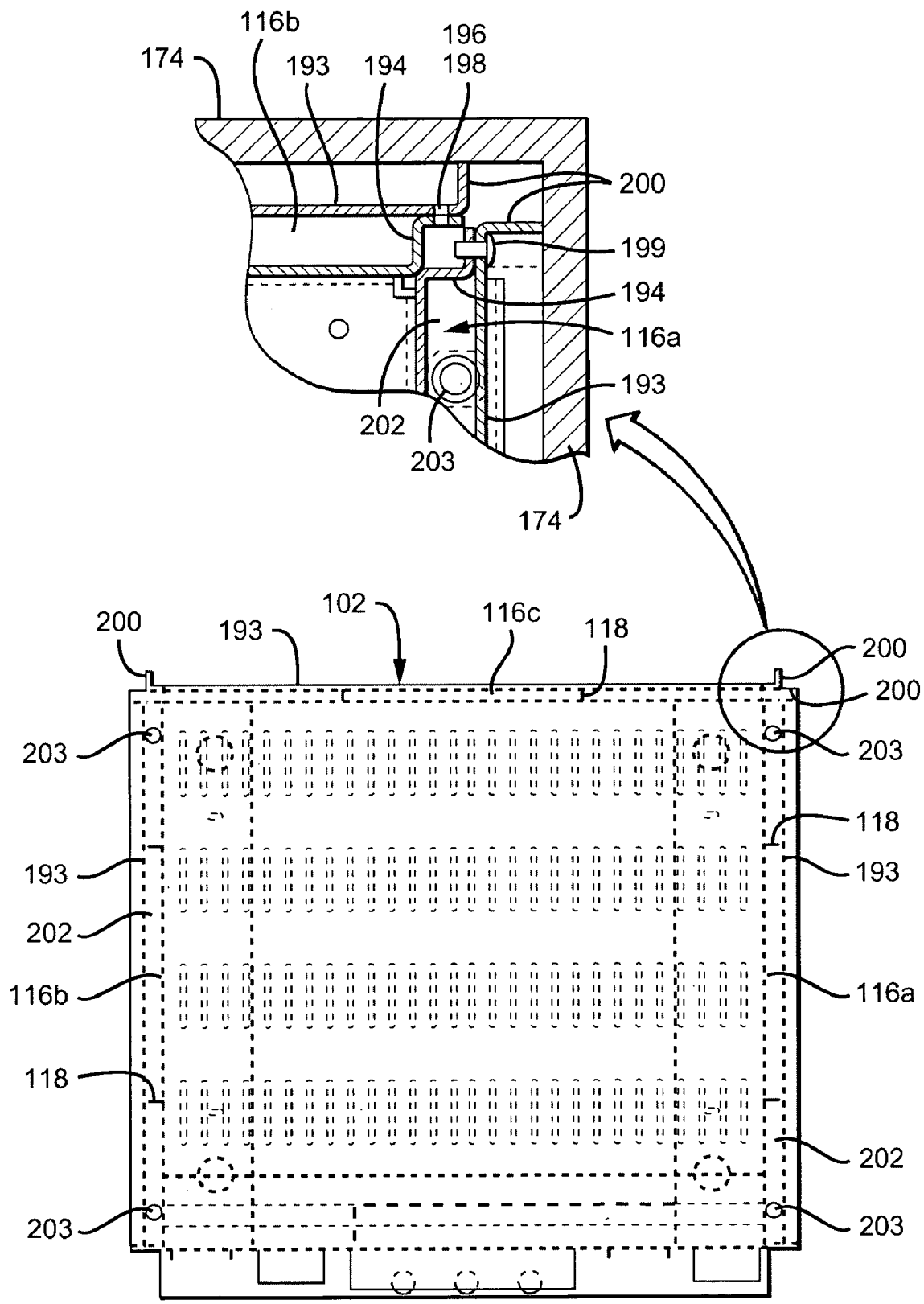
FIG. 8 is a top view of the embodiment of the inner cabinet s how n in FIG. 2.

FIGS. 8 shows top view of the inner cabinet 102 showing the right tray 116a, left tray 116b, and rear tray 116c, each having a top plate 193 to form an enclosure for the PCM. Each tray has spacers 118 extending between the bottom of each tray 116a-c and its top plate 193 to maintain spacing and structural rigidity within the panels. Each tray has inner flanges 194 with flange bolt holes 196 that are arranged to align with top plate bolt holes 198 to accept a bolt and screw 199 combination to mount the top plate to its respective tray. Other mounting methods can be used such as welds or clamps. Each top plate 193 also includes a top plate flange 200 that is preferably formed at a right angle to the top plate. The inner flanges and top plate flanges 200 provide structural rigidity to help the cabinet 100 withstand seismic events. The top edge of the top plate flanges 200 also rest against or extend partially into the insulation 174 on the adjacent inside surfaces of the outside cabinet 104. The top plate flanges 200 of each top plate 193 provide a barrier around each of its tray/insulation space such that the fan panel can draw air into one the spaces from the outside, without pulling air into the other tray/insulation spaces. Each of the trays also has a top end 202 with lifting bolt holes 203 that are arranged such that lifting bolts can be attached to the inner cabinet 102.

Figure 9:
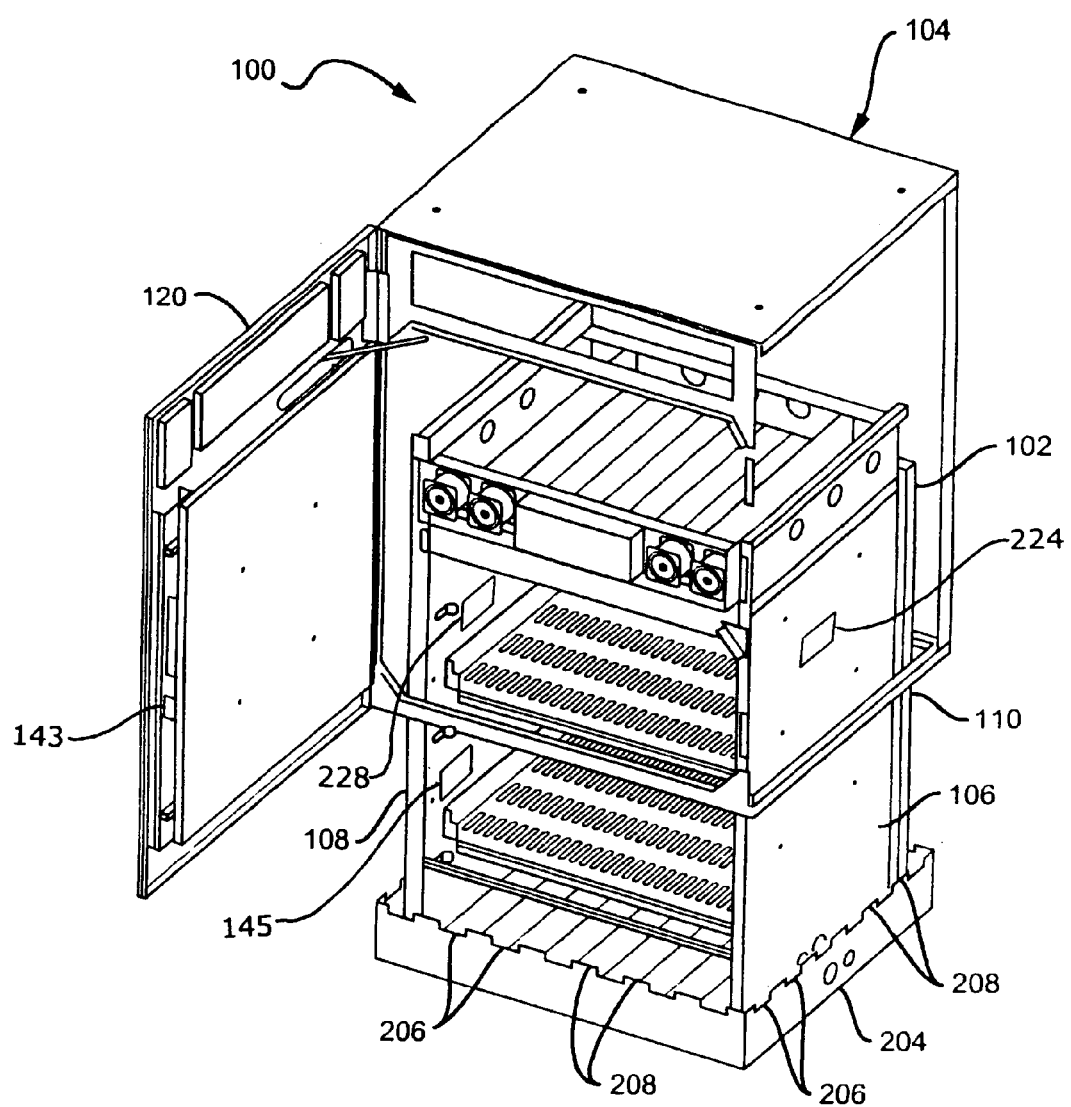
FIG. 9 is an exploded perspective e view of the cabinet shown in FIG. 2 that has ventilation slots for transfer of outside air inside the cabinet.

FIG. 9 shows the cabinet 100, with the outer cabinet 104 above the inner cabinet 102 showing the separation between the outer cabinet 104 and the cabinet base 204. The top edge of the cabinet base has a series of ventilation slots 206 to allow air to pass from outside the cabinet 100 into the tray/insulation spaces in the walls 106, 108, 110 and in the door 120. The ventilation slots 206 can extend either around the entire or a portion of the upper perimeter of a cabinet base 204. The outer cabinet 104 is adapted to slip over the inner cabinet 102 with the bottom edge of the outer cabinet resting on the heightened portions 208 of the base 204 with the ventilation slots 206 unobstructed in the finally assembled cabinet 100. The outer cabinet overhangs the base 204 so that rain does not run into the base 204 and the slots are above the ground so that store or flood water does not run into the base 204. The base 204 can be many different sizes and heights, with a preferred bass about 8 inches high and has welded solid edges.

Figure 10:
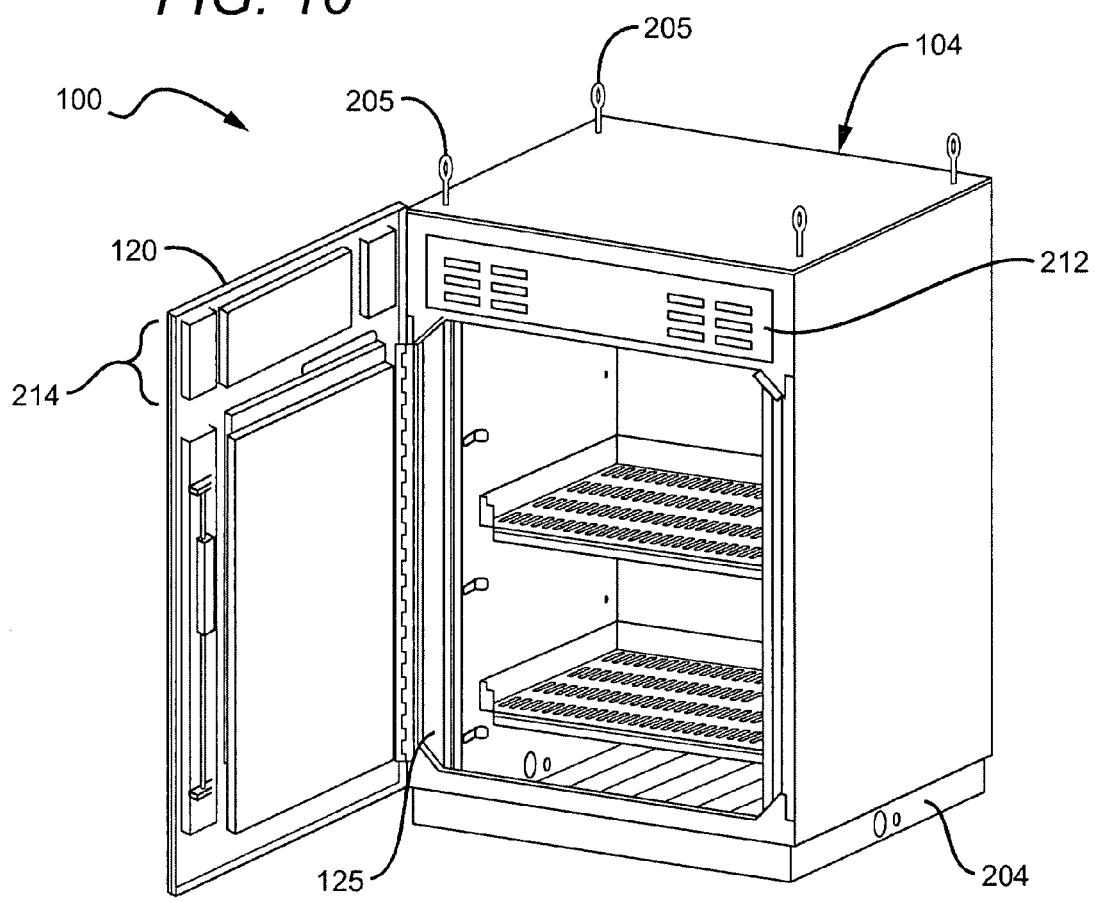
FIG. 10 is a perspective view of the cabinet in FIG. 2 that is assembled.

FIG. 10 is a perspective view of the assembled thermally insulated enclosure with the outer cabinet 104 mounted the cabinet base 204. A preferable mounting method is I-bolts 205 that pass through holes at the top four corners of the outer cabinet 104 and turn into the mounting holes 203 on the right and left trays 116a. 116b, as shown in FIG. 8. This allows the cabinet 100 to be lifted as one unit, with the inner cabinet 102 firmly mounted within the outer cabinet 104. When the cabinet door 120 is closed, air that is drawn from the upper tray by the fan panel 128 passes through a vent panel 212 to escape to the atmosphere through the non-airtight sealing surface of the top portion 214. These connections form a solid structure comprising the inner and outer cabinets which and the integrity of the overall cabinet is maintained in the event of an earthquake or other motion that disturbs the cabinet. The space between the two cabinets is maintained so that air can still flow through the air spaces.

Referring to FIGS. 1 and 2, during operation the left, right, rear and front fans 142, 144, 146, 150 are selectively operated to draw outside air into any of the tray/insulation spaces at the walls 106, 108, 110 and the door 120. This helps remove heat absorbed by change in states of the phase-change material. If the outside air drawn into the spaces is cooler than the phase-change material or the air in the spaces, then melted PCM can be more quickly re-solidified or if the PCM has not yet melted, the air drawn in can extend the time before it does melt. The air flow for each of the fans is shown in FIG. 2.

The right panel fan 144 can operate to draw outside through the right wall tray/insulation space as shown by right air flow 230 in FIG. 2. The fan 144 draws air through the slots 206 between the cabinet base 204 and the outer cabinet 104, adjacent to the right wall 106. The air then passes in the tray/insulation space at the right wall 106 and through the right ventilation holes 134. The air is then drawn through the upper right compartment of the upper tray 130 and through the right fan 144. The top plate flanges 200 (shown in FIG. 4) on the right wall 106 provide a barrier in the space between the right wall 106 and adjacent insulation 174 so that the right fan 144 only draws outside air in through the tray/insulation space at the right wall 106.

The rear panel fan 146 and left panel fan 142 work in much the same way to draw outside air through their respective tray/insulation spaces along rear and left airflows 232, 234. The rear panel fan 146 draws air through the slots 206 adjacent to the rear wall 110 and into the tray/insulation space at the rear wall 110. The air is then drawn through the rear ventilation holes 136, through the center compartment of the upper tray 130 and out the rear panel fan 146. The left panel fan 142 draws air through the slots 206 adjacent to the left wall 108 and through the left ventilation holes 132. The air is then drawn through the left compartment of the upper tray 130 and through the left fan 142.

The front fan 150 draws outside air through the door tray/insulation space along door airflow 234, through the slots adjacent to the cabinet door 120 and then through the door tray/insulation space. The air then passes through the bottom holes 152 (shown in FIG. 1) of the fan box 148 and then through the back holes 154 (shown in FIG. 1) of the fan box 148. The air is then drawn through the front compartment of the upper tray 130 and out through the front fan 150.

This fan arrangement is particularly adapted for cooling the PCM during the normal daily heat cycles, primarily when the sun goes down and the air outside the cabinet is cooler than the PCM or the air in the one or more of the tray/insulation spaces. In this case, the appropriate fans can be operated to draw the cooler air into the spaces. The fan arrangement is also adapted for use during the day when the sun can be directed on one of the surfaces of the outside cabinet 104 such that the surface can become hotter than the surrounding ambient. This can cause the space between the PCM or tray/insulation space adjacent to the heated surface to also be heated above the surrounding ambient. When this occurs the appropriate one of the fans 142, 144, 146, 150 can be operated to draw the cooler ambient air into the heated tray/insulation space to cool the air and/or the PCM.

It is understood that many different fan arrangements can be used to draw outside air into the appropriate tray/insulation spaces. For example, a series of smaller fans could be placed over each of the tray/insulation spaces, near the top of the inner cabinet 102, to draw up the air. A path can then be provided to allow the air to pass out of the cabinet 100.

Many different devices can be used to measure the outside temperature in the door tray/insulation spaces. In one embodiment according to the present invention, an electronic door temperature sensor 143 is positioned in the space between the insulation on the inside surface of the cabinet door 120 and the door tray 122 to measure the temperature in this space. Similar left, right and rear temperature sensors 222, 224, 226 are provided in the left, right and rear spaces between the PCM and insulation to measure the temperatures in the spaces. An inner cabinet temperature sensor 145 can also be provided in an interior of the inner cabinet 102 to measure the air temperature and/or the temperature of the batteries or other devices held in the inside cabinet 102.

Many different control devices can also be used to read the temperatures from the temperature sensors to determine which fans should be operated and when they should be operated. A preferred control module is an electronic module 228 that can be provided to read the signals from the various electronic temperature sensors. The module can be positioned in many different locations within the cabinet 100, with the module 228 as shown being positioned on the interior of the inner cabinet 102.

Figure 11A:
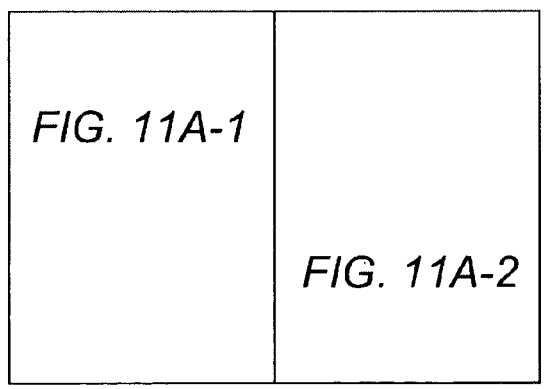
FIGS. 11A-11C are schematics of one embodiment of a fan controller according to the present invention.
Figure 11C:
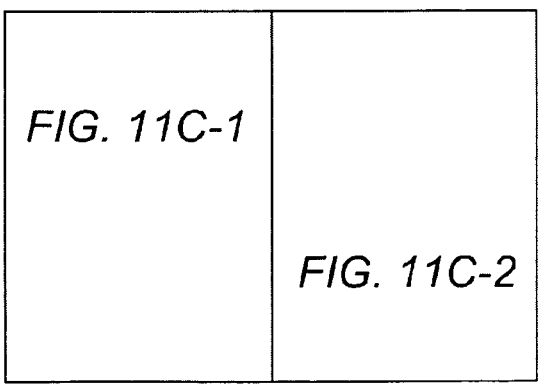
Figures 1, 11A:
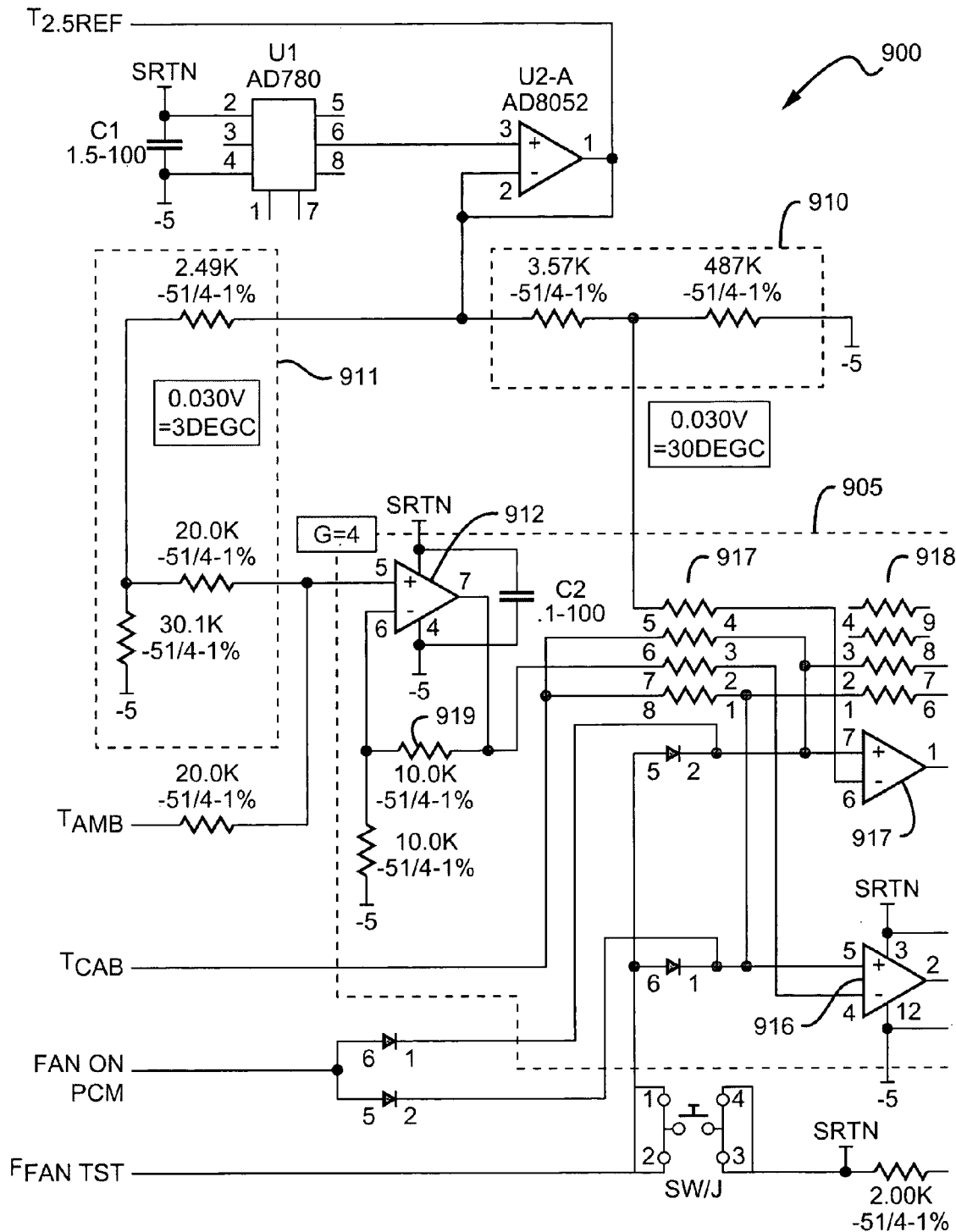
Figures 2, 11A:
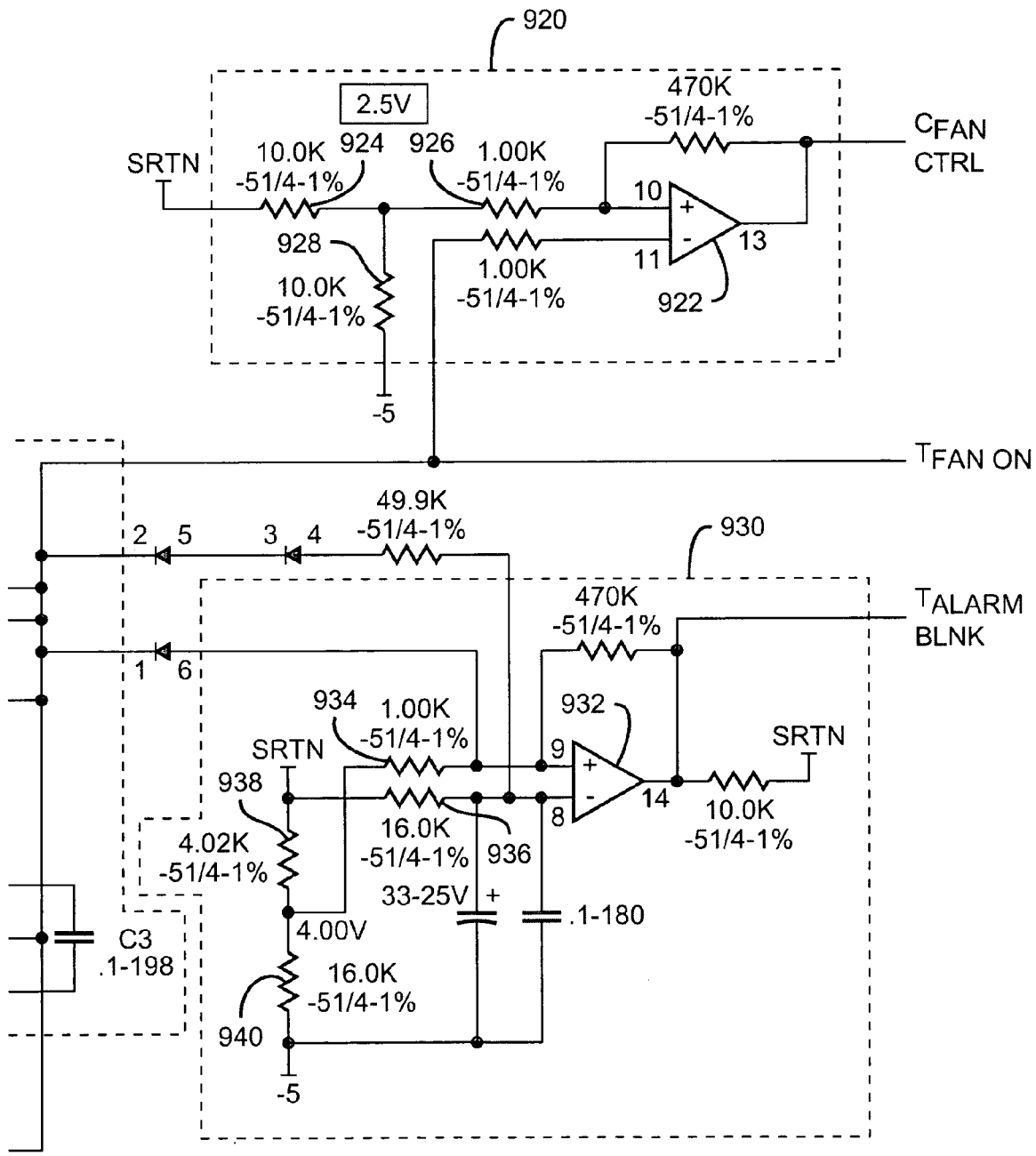
Figure 11B:
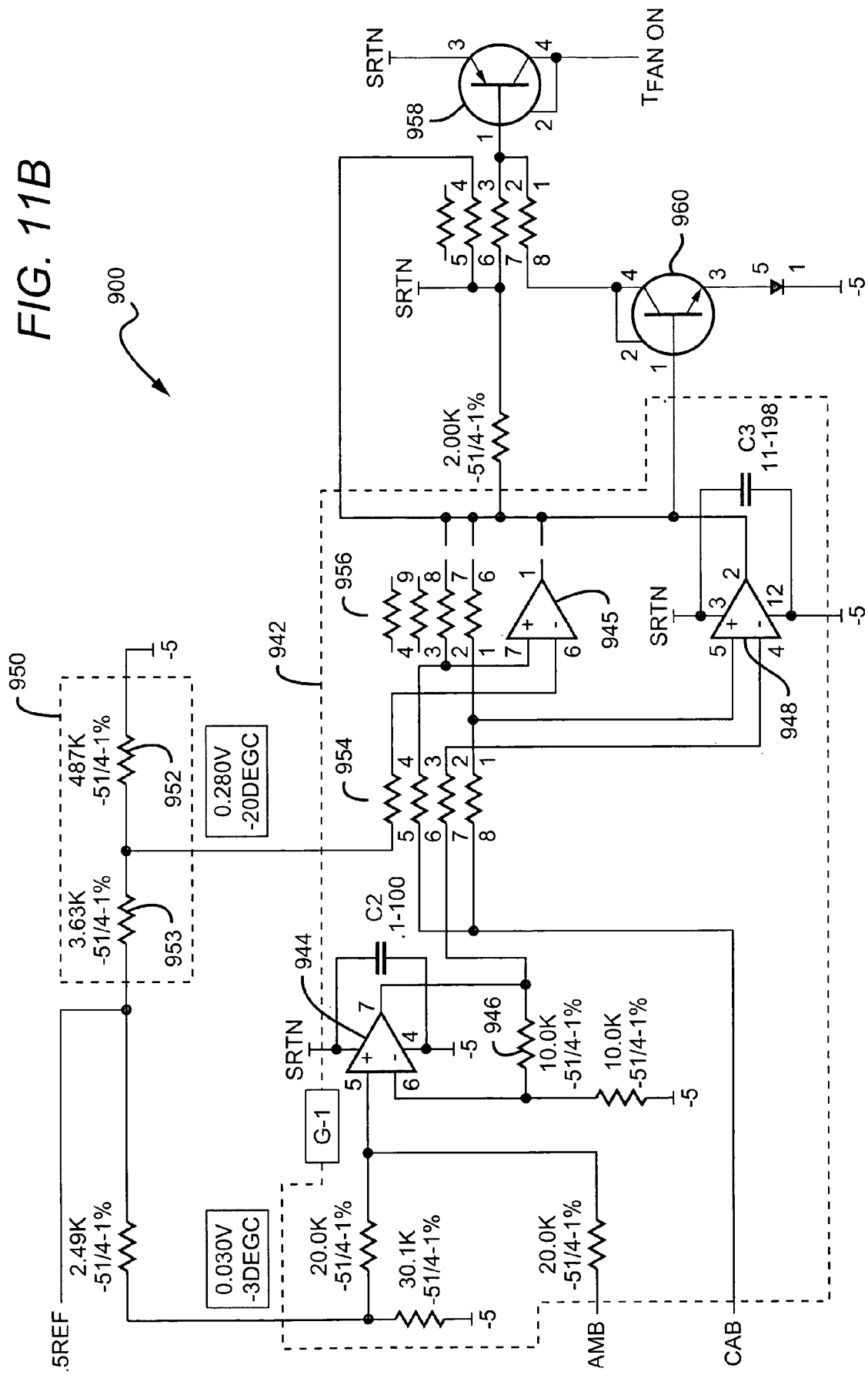
Figures 1, 11C:
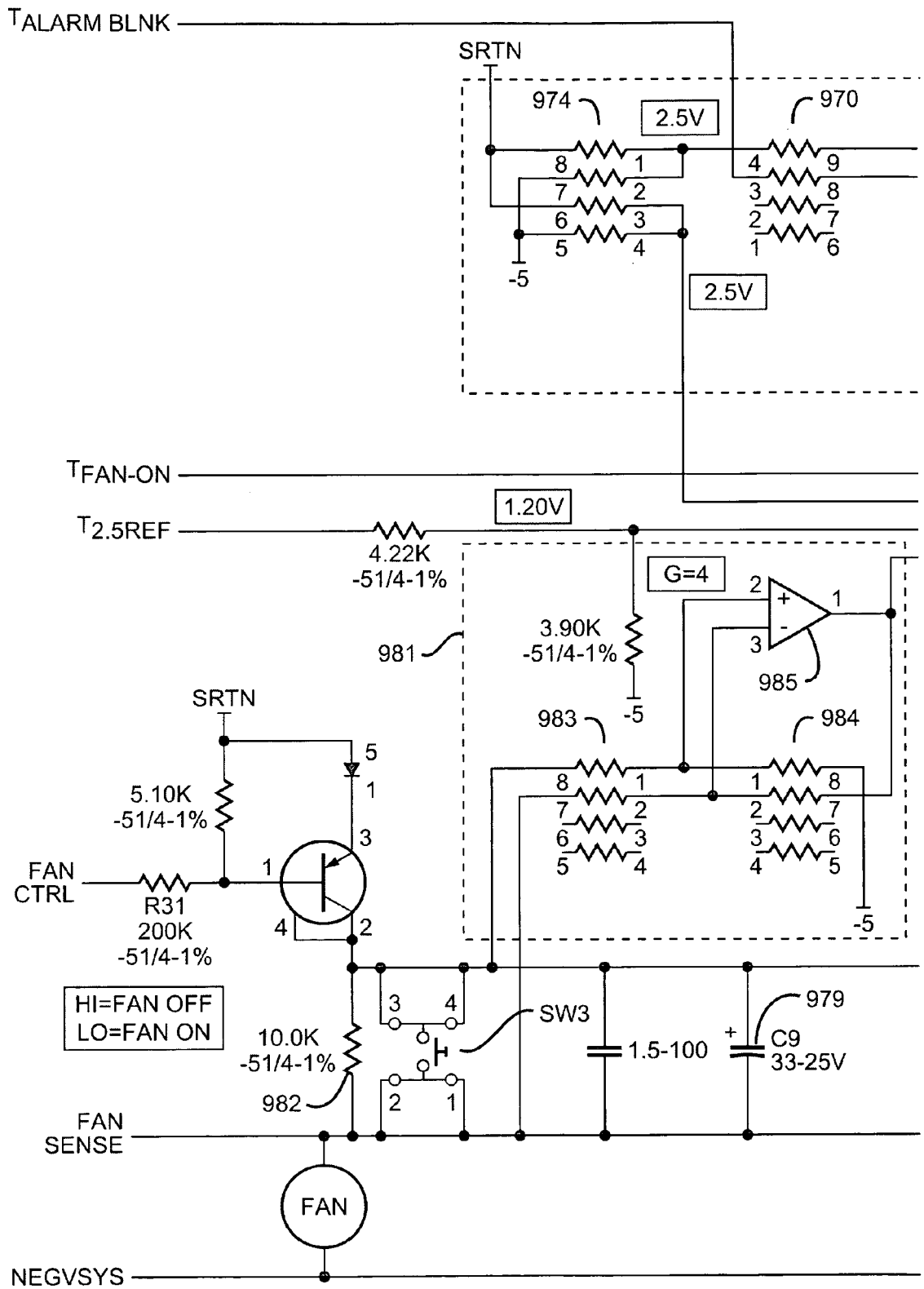
Figures 2, 11C:
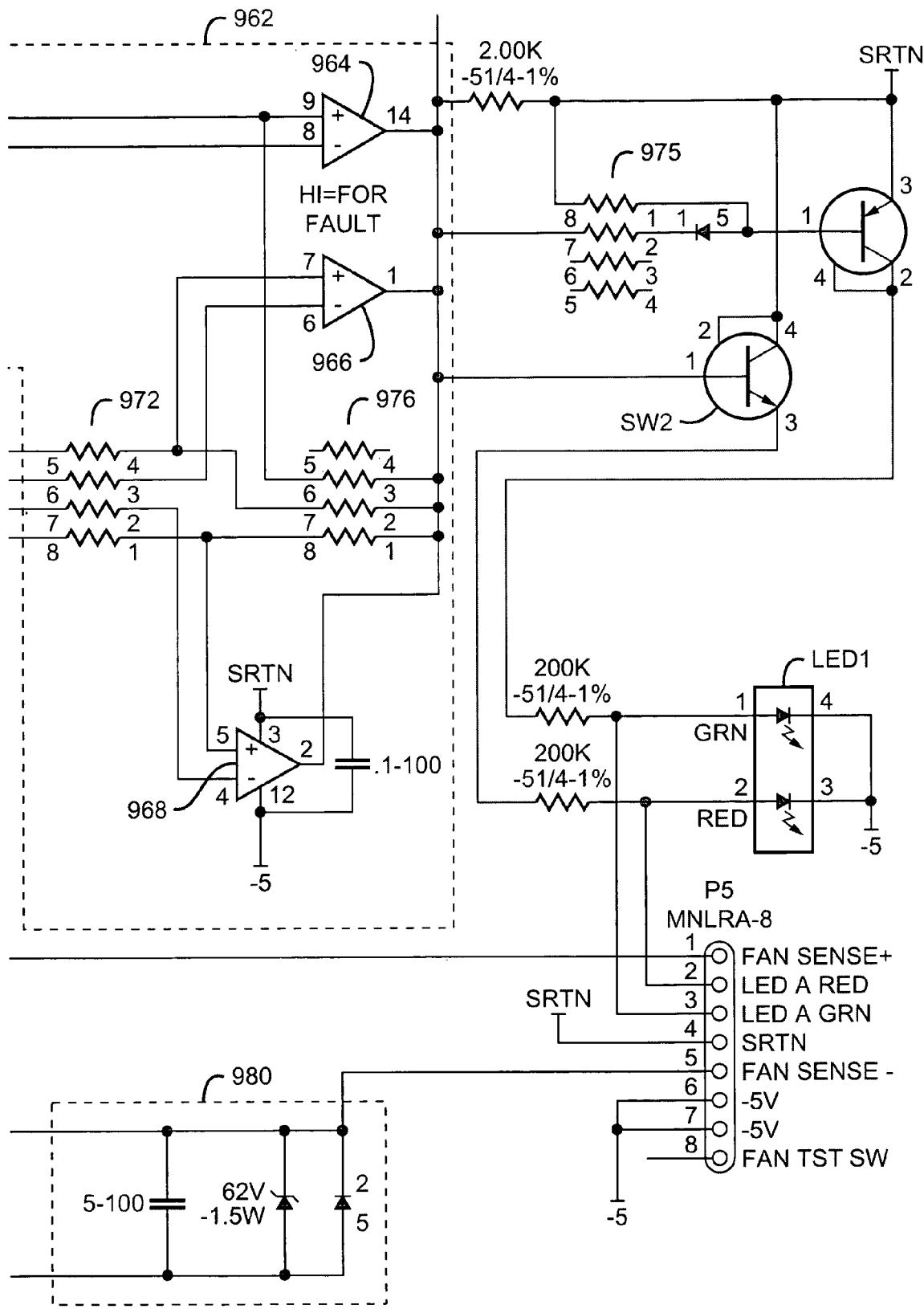

FIGS. 11a through 11c illustrate one embodiment of a single fan controller 900 to provide an on and off control signal to one of the fans 142, 144, 146, 150 in response to predetermined temperatures received from the front, inner cabinet, right, left, rear and ambient temperature sensors. In the present embodiment, there is one fan controller for each of the left, rear and right panel fans 142, 144, 146. The fans are turned on to use cooler ambient air to reduce heat within the electrical enclosure and/or to change phase-change material from a liquid to a solid state in preparation for another cycle of thermal exposure. Due consideration is given to the phase-change material's melting point, atmospheric conditions surrounding and conditions within the cabinet 100 to remove heat from the interior to the exterior of the cabinet 100.

In one embodiment of a controller 900 according to the invention, the fan controller 900 turning on its particular fan when the outside ambient temperature is greater than 7° C. and less than the inside PCM temperature as measured at one of the cabinet walls. This would cool down the PCM when it is above 29° C. and solidify the PCM when it is above 29° C. In this embodiment of the controller 900 the fan is also turned on when the outside ambient temperature is 3° C. less than the air gap temperature and the outside ambient temperature is greater than 7° C. This would allow for air to circulate through the air gap when solar loading significantly raises the PCM/insulation space. The 3° C. difference accounts for the increased heat transfer efficiency for turbulent air over static air.

In another embodiment of a controller 900 according to the present invention the fan is turned on when both the outside ambient temperature is 3° C. less than the air temperature in the particular PCM/insulation space and the air gap temperature is greater than 30° C. By way of example, the ambient and right panel temp sensors provide signals that have a voltage indicative of the ambient temperature outside the electrical panel and the right PCM/insulation space temperature. The voltages are provided to terminals $T_{AMB}$ and $T_{GAP}$, respectively in the fan controller 900. An ambient/air gap comparator circuit 905 compares the two signals and uses a temperature reference circuit 910 that sets the reference temperature, in this example, to 30° C.

More particularly, the ambient/air gap comparator 905 can be implemented with amplifiers 912, 914 and 916. Many different commercially available amplifiers can be used, with the preferred amplifier 912 being an AD8052 offered by Analog Devices, Inc., and the remaining amplifiers in FIG. 11a being LM339M offered by Fairchild Semiconductor International Inc.

Power conditioner 917 sets input threshold voltages for amplifiers 914 and 916. Amplifier 914 compares the air gap temperature signal received from terminal $T_{GAP}$ with the 30° C. reference voltage from the temperature reference circuit 910 to determine if the air gap temperature is greater than 30° C. Power conditioner 918 sets a voltage threshold for the feedback signal from the output of amplifiers 914 and 916 to each of their non-inverted inputs. Resistor network 911 provides a voltage bias to amplifier 912, which enables amplifier 912 to output a voltage representing a 3° C. drop in temperature from $T_{AMB}$ to amplifier 916 for comparison to $T_{GAP}$. If both conditions (1) and (2) are satisfied, amplifier 916 provides a fan turn on signal to fan-turn-on circuit 920, which is preferably implemented with amplifier 922. Many different power conditioners can be used, with power conditioners 917 and 918 preferably being model numbers 8DM01K and 8DM-270K power conditioners, respectively.

A HIGH signal indication, for purposes of this embodiment of the invention, is a signal having −5 volts. The inverting input of amplifier 922 is coupled to the output of amplifiers 914 and 916 and to terminal $T_{FAN\text{-}ON}$ to receive indication of the on/off state of the fan, with HIGH indicating a fan-on condition. Resistors 924, 926 and 928 provide a 2.5 volt bias for amplifier 922 from a −5 volt supply rail.

The fan is turned on when both the outside ambient temperature is 3° C. less than PCM/insulation space temperature and the air gap temperature is greater than 280 C. FIG. 11b is a schematic of a portion of the fan controller 900 that implements this second case by comparing the internal cabinet and ambient air temperatures. An ambient/inner-cabinet comparator circuit 942 compares signals received from terminals $T_{AMB}$ and $T_{CAB}$. Terminal $T_{CAB}$ receives from inner cabinet temperature sensor 145 a voltage signal representing the air temperature within the inner cabinet 102. The ambient/inner cabinet comparator circuit 942 can be implemented with amplifiers 944, 946 and 948. A voltage drop across resistor 945 provides a voltage bias to amplifier 944, which enables amplifier 944 to output to amplifier 948 a voltage signal representing a 3° C. drop in the temperature signal received from the ambient temperature sensor through terminal $T_{AMB}$. Amplifier 948 compares output of amplifier 944 with the signal from $T_{CAB}$ which indicates temperature inside the internal cabinet 102. To determine if the air gap temperature is greater than 28° C., amplifier 945 compares the signal from terminal $T_{CAB}$ with output voltage from a 28° C. reference circuit 950, preferably implemented with resistors 952 and 953. Power conditioner 954, preferably model number 8DM-1K provided by CTS Corporation, sets the input threshold voltages for amplifiers 945 and 948. Power conditioner 956, preferably model number 8DM-270K also offered by CTS Corporation, provides feedback voltage for the non-inverting inputs of amplifiers 945 and 948. If both conditions are satisfied, then output of the ambient/inner-cabinet comparator circuit 942 provides an ON signal to switches 958 and 960 to switch on current to the fan (HIGH indicating on).

In either of the two cases, a blank pulse circuit 930 provides a momentary blanking pulse to disable a fan-fault alarm when either of the ambient/air gap and ambient/inner-cabinet comparator circuits 905 and 942 triggers a fan ON condition. The blank pulse circuit 930 can be implemented with amplifier 932. Resistors 934, 936, 938 and 940 provide biasing for amplifier 932 from the −5 volt supply rail and 0 volt reference at terminal SRTN. The blanking pulse is communicated to terminal $T_{ALARM\ BLNK}$. A fan tester switch FW1 is coupled to terminal $F_{FAN\ TST}$ to bypass the ambient/air gap and ambient/inner-cabinet comparator circuits 905 and 942 so the fan can be turned on for testing.

All diodes illustrated in FIGS. 11a, 11b are preferably model BAS21U diodes offered by Infineon Technologies AG. Resistor values are illustrated within the figures and are expressed in Ohms. Capacitor values are also illustrated within the figures and are expressed in microFarads. Terminals SRTN and $T_{2.5REF}$ provide 0 and 2.5 volt reference voltages, respectively.

FIG. 11c illustrates one embodiment of the fan controller 900 that provides surge, under and over voltage and EMF protection circuits and an alarm circuit 962. The alarm circuit 962 receives a 2.5 volts reference voltage through terminal $T_{2.5\ REF}$ and is coupled to terminals $T_{FAN-ON}$ and $T_{ALARM-BLNK}$ to receive fan on and alarm blanking signals, respectively. The alarm circuit 962 can be implemented with amplifiers 964, 966 and 968. Power conditioner 970 sets the threshold voltage for inverting and non-inverting inputs of amplifier 964. Similarly, power conditioner 972 sets the threshold and feedback voltages for amplifiers 966 and 968. Power conditioner 976 is coupled to the output of the amplifiers (964, 966 and 968) to provide feedback to the non-inverting input of amplifiers 964 and 968. Power conditioners 970/972, 974/975 and 976 can be power conditioner model numbers 8DM-1K, 8DM-10K and 8DM-470K, respectively. If the output of amplifiers 964, 966 and 968 provide an output HIGH, the output HIGH triggers a red LED warning light by switching on switch SW2 that provides current to a lamp LED1, which displays a red light. During turn on, an alarm blanking signal is provided to the alarm circuit 962 from the blank pulse circuit 930 through the $T_{ALARM\ BLK}$ terminal and a charge is also provided to the fan by capacitor 979 for faster turn on. Protection circuit 980 provides feedback noise protection, over voltage protection and EMF resistance to the fan. Voltage comparison circuit 981 compares the voltage across resistor 982 to determine if the fan is rotating by way of the voltage across the fan. The comparison circuit 981 can be implemented with power conditioners 983 and 984, preferably model number 8DM-10K and 8DM-39K, respectively, that establish a threshold voltage for the inverting and non-inverting inputs of amplifier 985.

While several illustrative embodiments of the invention have been shown and described primarily in terms of an electrical enclosure, numerous variations and alternate embodiments will occur to those skilled in the art for other applications and implementations such as food and beverage storage and biological material storage. Such variations and alternate embodiments are contemplated, and can be made without departing from the spirit and scope of the invention as defined in the appended claims.

What is claimed is:

1. A cabinet, comprising:
    an inner cabinet comprising a plurality of inner walls that form an enclosure;
    a first phase change material (PCM) and covering at least some of said plurality of inner walls;
    an outer cabinet positioned around said inner cabinet and also comprising a plurality of outer walls arranged such that there is a space between said inner and outer walls; and
    a mechanism for drawing air from outside of said outer cabinet into the space between said inner and outer walls, wherein said first PCM is arranged in horizontal compartments covering at least one of substantially vertical walls and wherein said horizontal compartments comprise tubes filled with said phase change material, said tubes on top of one another on said at least one of said substantially vertical walls.

2. The cabinet of claim 1, wherein said inner cabinet comprises top and bottom walls and said plurality of substantially vertical walls running between said top and bottom wall.

3. The cabinet of claim 2, wherein said top and bottom walls are covered by a layer of said phase change material.

4. The cabinet of claim 1, wherein at least some of said outer walls are adjacent to said substantially vertical walls, said mechanism for drawing air arranged to draw outside air between each of said substantially vertical walls and its adjacent one of said outside walls.

5. The cabinet of claim 4, wherein said mechanism for drawing air comprises a fan panel having a plurality of fans, each of which is arranged to draw outside air between one of said substantially vertical walls and its adjacent one of said outside walls.

6. The cabinet of claim 5, wherein said fan panel can selectively operate each of its said plurality of fans to selectively draw outside air between one of said substantially vertical walls and its adjacent one of said outside walls.

7. The cabinet of claim 1, further comprising a controller for controlling said mechanism for drawing air.

8. The cabinet of claim 1, wherein each of said substantially vertical walls comprises a tray for holding said phase change material.

9. The cabinet of claim 1, further comprising a layer of insulation on an inside surface of each of said outer walls.

10. The cabinet of claim 1, wherein said inner cabinet is arranged to hold batteries, said inner cabinet further comprising a hydrogen filter to expel hydrogen from within said inner cabinet.

11. The inner cabinet of claim 1, further comprising an air inlet duct to allow air into said inner cabinet as a hydrogen filter expels hydrogen.

12. The cabinet of claim 1, wherein said first PCM comprises a hydrated salt.

13. The cabinet of claim 1, wherein said first PCM comprises a linear crystalline alkyl hydrocarbon.

14. A cabinet, comprising:
    an inner cabinet comprising a plurality of inner walls that form an enclosure;
    a first phase change material (PCM) and covering at least some of said plurality of inner walls;
    an outer cabinet positioned around said inner cabinet and also comprising a plurality of outer walls arranged such that there is a space between said inner and outer walls; and
    a mechanism for drawing air from outside of said outer cabinet into the space between said inner and outer walls, further comprising an air inlet duct to allow air into said inner cabinet as a hydrogen filter expels hydrogen, wherein said inlet duct comprises a tube surrounded by a second PCM said inlet duct entering said outer cabinet and running along one of said space between said inner and outer walls and then entering said inner cabinet.

15. The cabinet of claim 14, wherein said first PCM is arranged in horizontal compartments covering at least one of said plurality of inner walls.

16. The cabinet of claim 14, wherein said inner cabinet comprises top and bottom walls and a plurality of substantially vertical walls running between said top and bottom wall.

17. The cabinet of claim 16, wherein at least some of said outer walls are adjacent to said substantially vertical walls, said mechanism for drawing air arranged to draw outside air between each of said substantially vertical walls and an adjacent one of said outer walls.

18. The cabinet of claim 16, wherein each of said substantially vertical walls comprises a tray for holding said first phase change material.

19. The cabinet of claim 16, wherein said top and bottom walls are covered by a layer of said first phase change material.

20. The cabinet of claim 14, wherein said mechanism for drawing air comprises a fan panel having a plurality of fans, each of which is arranged to draw outside air between one of said plurality of inner walls and an adjacent one of said outer walls.

21. The cabinet of claim 20, wherein said fan panel can selectively operate each of its said plurality of fans to selectively draw outside air between one of said plurality of inner walls and its adjacent one of said outer walls.

22. The cabinet of claim 14, further comprising a controller for controlling said mechanism for drawing air.

23. The cabinet of claim 14, further comprising a layer of insulation on an inside surface of each of said outer walls.

24. The cabinet of claim 14, wherein said inner cabinet is arranged to hold batteries, said inner cabinet further comprising a hydrogen filter to expel hydrogen from within said inner cabinet.

25. The cabinet of claim 14, wherein said first PCM comprises a hydrated salt.

26. The cabinet of claim 14, wherein said second PCM comprises a hydrated salt.

27. The cabinet of claim 14, wherein said first PCM comprises a linear crystalline alkyl hydrocarbon.

28. The cabinet of claim 14, wherein said second PCM comprises a linear crystalline alkyl hydrocarbon.

* * * * *